United States Patent [19]
Yuan et al.

[11] Patent Number: 5,981,969
[45] Date of Patent: *Nov. 9, 1999

[54] MULTIPLE PEAK RESONANT TUNNELING DIODE

[75] Inventors: Han-Tzong Yuan, Dallas; Alan Carter Seabaugh, Richardson, both of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/145,722

[22] Filed: Oct. 29, 1993

Related U.S. Application Data

[63] Continuation of application No. 07/954,206, Sep. 30, 1992, abandoned.

[51] Int. Cl.$^6$ .................................................. H01L 29/06
[52] U.S. Cl. .............................. 257/25; 257/183; 257/189
[58] Field of Search .............................. 257/7, 9, 13, 14, 257/15, 16, 21, 22, 25, 189, 183, 618

[56] References Cited

U.S. PATENT DOCUMENTS

| | | | |
|---|---|---|---|
| 4,599,728 | 7/1986 | Alvai et al. | 257/189 |
| 4,853,753 | 8/1989 | Capasso et al. | 257/25 |
| 4,959,696 | 9/1990 | Frensley et al. | 257/25 |
| 4,999,697 | 3/1991 | Capasso et al. | 257/15 |
| 5,270,225 | 12/1993 | Goronkin et al. | 257/25 |

FOREIGN PATENT DOCUMENTS

| | | | |
|---|---|---|---|
| 63-124578 | 5/1988 | Japan | 257/25 |
| 1124268 | 5/1989 | Japan | 257/25 |

OTHER PUBLICATIONS

"Nine–State Resonant Tunneling Diode Memory" by A. C. Seabaugh, Yung–Chung Kao and Han–Tzong Yuan, *IEEE Electron Device Letters*, vol. 13, No. 9, Sep. 1992.

"A Triple–Well Resonant–Tunneling Diode for Multiple–valued Logic Application" by T.Tanoue, H. Mizuta and S. Takahashi, *IEEE Electron Device Letters*, vol. 9, No. 8, Aug. 1988.

"Resonant Tunneling Devices with Multiple Negative Differential Resistance and Demonstration of a Three–State Memory Cell for Multiple–Valued Logic Applications" by F. Capasso, S. Sen, Alfred Y. Cho and D. Sivco, *IEEE Electron Device Letters*, vol. EDL–8, No. 7, Jul. 1987.

Potter et al., "Three Dimensional Integration of Resonant Tunneling Structures for Signal Processing and Three–State Logic" Appl. Phys. Lett., vol. 52, #25, Jun. 20, 1988—pp. 2163–2164.

Ozbay et al, "110–GHZ Monolithic Resonant–Tunneling–Diode Trigger Circuit," IEEE Electron Device Letters, vol. 12, #9, Sep. 1991, pp. 480–482.

*Primary Examiner*—Sara Crane
*Attorney, Agent, or Firm*—W. Daniel Swayze, Jr.; Wade James Brady, lll; Richard L. Donaldson

[57] ABSTRACT

A multiple peak resonant tunneling diode (10) includes multiple vertical semiconductor structures (12, 13). The vertical structures (12, 13) include a resonant tunneling diode having a predetermined cross-sectional area and a series resistor of a predetermined resistance. The vertical structures (12, 13) are spaced from one another and interconnected in parallel. Additionally, the vertical semiconductor structures (12, 13) are fabricated such that their predetermined diode cross-sectional areas and series resistances have values that vary by predetermined amounts to adjust the respective peak currents and/or peak voltages of the vertical semiconductor structures (12, 13).

15 Claims, 3 Drawing Sheets

MULTIPLE PEAK RESONANT TUNNELING DIODE

This application is a Continuation of application Ser. No. 07/954,206, filed Sep. 30, 1992, now abandoned.

TECHNICAL FIELD OF THE INVENTION

This invention relates in general to the field of semiconductor devices, and more particularly the present invention relates to a multiple peak resonant tunneling diode.

BACKGROUND OF THE INVENTION

It has been widely recognized that multiple peak resonant tunneling diodes (RTDs) are useful in several circuit applications. These include multi-state memory, high speed analog-to-digital converters, multi-valued logic circuits, parity bit generators, and neural networks. For these applications, the multiple peak RTD device exhibits multiple equally-spaced peaks and valleys in its current-voltage (I–V) characteristics. A further requirement demands that the largest valley current not exceed the smallest peak current.

Conventional methods for fabricating a multiple peak RTD involve integrating serially connected multiple RTDs in an epitaxial stack. However, the number of peaks is limited by the accumulated series resistance of the undoped double-barrier structure, which produces undesirable hysteresis in its I–V characteristics. In addition, the RTDs' peak-to-peak and valley-to-valley separation cannot be made smaller than that of a single RTD. Another known multiple peak device is fabricated with multiple potential barriers and quantum wells, but this type of device is difficult to design to accomplish low valley currents in its I–V characteristics.

Accordingly, it has become desirable to provide a multiple peak RTD devices which possess desirable I–V characteristics at normal operating temperatures. Furthermore, in the interest of large scale integration, device compactness and ease in fabrication are additional important and desirable properties.

SUMMARY OF THE INVENTION

In accordance with the present invention, a multiple peak resonant tunneling diode is provided which substantially eliminates or reduces disadvantages and problems associated with prior devices.

In one aspect of the present invention, the multiple peak resonant tunneling diode includes a first vertical semiconductor structure. The vertical structure includes a resonant tunneling diode having a predetermined cross-sectional area and a series resistor of a predetermined resistance. Additionally, at least one other vertical semiconductor structure is positioned spaced apart from the first vertical semiconductor structure. The vertical semiconductor structures are fabricated such that their predetermined diode cross-sectional areas and series resistances have values that vary, by predetermined amounts, to achieve control of the voltage and current of the resonance peak of the vertical semiconductor structures. Parallel connection of the vertical semiconductor structures is used to produce a multiple peak resonant tunneling diode with predetermined peak voltage and current values.

In another aspect of the present invention, a semiconductor device for producing multiple equally-spaced peaks in current-voltage characteristics is provided. The semiconductor device includes a first vertical semiconductor structure which is a first resonant tunneling diode and a series resistor stacked vertically one on top of the other and arranged perpendicularly with respect to a horizontal substrate. Multiple other vertical semiconductor structures are positioned spaced from the first vertical semiconductor structure and spaced from one another. The predetermined resonant tunneling diode cross-sectional areas and series resistances of the vertical semiconductor structures have values selected to produce multiple equally-spaced peaks in the current-voltage characteristics when the vertical semiconductor structures are connected in parallel.

Since the resistor-resonant tunneling diode structures are vertically oriented, an important advantage of the present invention is the compactness of the multiple peak device. The desirable multiple-peak current-voltage characteristics for contemplated device applications is achievable under normal operating conditions. Additionally, the peak current and/or peak voltage variations between each vertical structures can be easily designed and fabricated using conventional semiconductor fabrication methods.

BRIEF DESCRIPTION OF THE DRAWINGS

For a better understanding of the present invention, reference may be made to the accompanying drawings, in which.

DETAILED DESCRIPTION OF THE INVENTION

Figure 1:
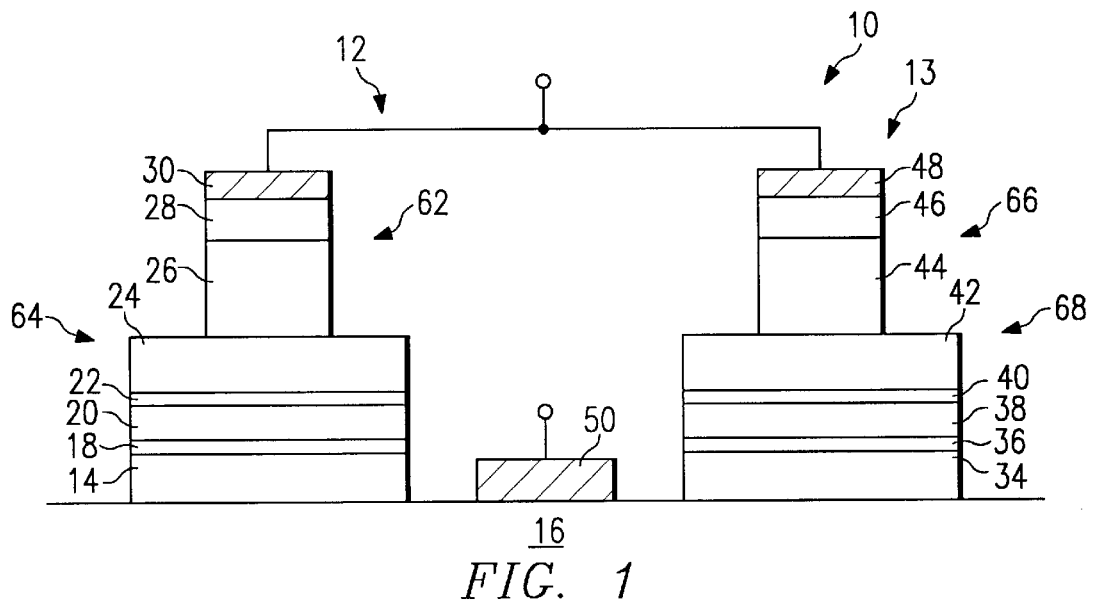
FIG. 1 is a schematic cross-sectional view of a preferred embodiment of the multiple peak resonant tunneling diode fabricated according to the present invention.

With reference to the drawings, FIG. 1 illustrates an exemplary physical embodiment of the multiple peak resonant tunneling diode (RTD), indicated generally at 10 and constructed according to the teaching of the present invention. The view shown in FIG. 1 is not to scale, and certain dimensions are greatly exaggerated or diminished for clarity.

The preferred embodiment of multiple peak RTD 10 may include multiple devices, but only two, shown as devices 12 and 13, are illustrated in FIG. 1. Device 12 is fabricated by forming a 0.5 micrometer, heavily doped n+ contact layer 14, of $In_{0.53}Ga_{0.47}As$ on top of a substrate layer 16. An exemplary doping concentration of contact layer 14 is approximately $1\times10^{18}$ cm$^{-3}$. Substrate layer 16 is preferably of indium phosphide. There is then formed on top of layer 14, in succession, an AlAs (aluminum arsenide) barrier layer 18, undoped, grown to a thickness of 1.5 to 2 nanometers; a well layer 20 formed of $In_{0.53}Ga_{0.47}As$, undoped, and grown to a width of 4 nanometers; a second AlAs barrier layer 22, 1.5 to 2 nanometers wide. On top of barrier layer 22, a RTD n+ layer 24 of indium gallium arsenide is formed with a doping concentration of approximately $1\times10^{18}$ cm$^{-3}$. Accordingly, layer 24 has negligible resistance. Layers 14–24 are processed into a mesa device structure with a diameter of 1–2 μm.

On top of layer 24 is formed a resistive layer 26 of n-indium gallium arsenide, with a doping concentration of approximately $2.5\times10^{16}$. The doping concentration may be computed by solving for n in the following equation:

$$R = \frac{\rho l}{A} \quad (1)$$
$$= \frac{l}{q\mu nA}$$

where A is the cross-sectional area of layer 26, l is the length or height of layer 26, q is the magnitude of the electron charge ($1.6\times10^{-19}$ coulomb), μ is the mobility of electrons in indium gallium arsenide (5000 cm$^2$/V-sec), ρ is the resistivity, and R is the resistance. Therefore, knowing the desired resistance R and determining the dimensions for layer 26 yields the necessary doping concentration for layer 26. For example, let the diameter of the cross-sectional area A of layer 26 be 1 μm, and the length l of layer 26 be $200\times10^{-7}$ cm, and the desired resistance R is 120 Ω. Solving for n, the doping concentration is approximately $2.5\times10^{16}$ cm$^{-3}$.

Above resistive layer 26, an n+ indium gallium arsenide layer 28 with negligible resistance is formed. The doping concentration of layer 28 may be approximately $5\times10^{18}$ cm$^{-3}$. An ohmic contact 30 of low resistance is formed on top of layer 28.

Figure 6:
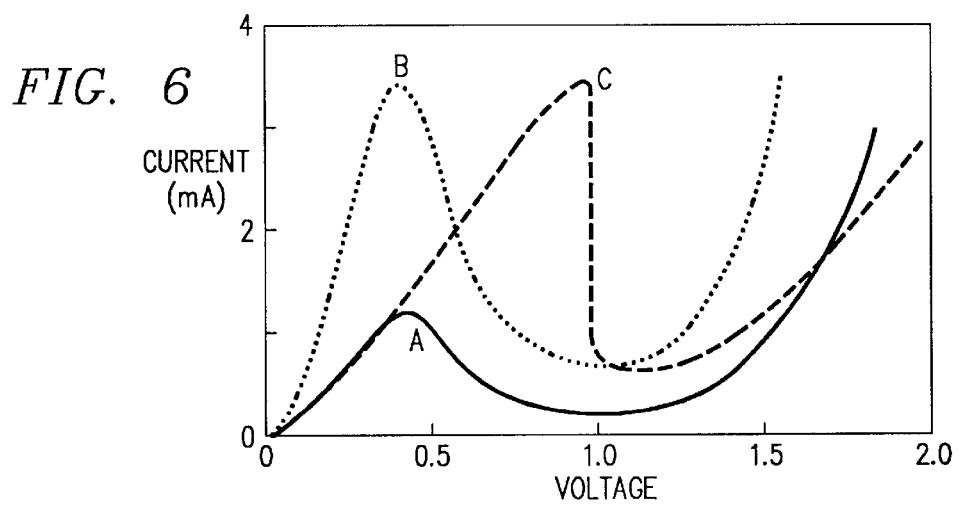
FIG. 6 is a current versus voltage plot showing the effect of larger diode area and series resistance.

A second device 13 connected in parallel with device 12 can also be formed on the same substrate 16. In order to construct a multiple peak RTD device, known properties of RTDs are utilized. FIG. 6 shows how the current-voltage (I–V) plot of an RTD depends on the device area and added series resistance. Referring to FIG. 6, trace A represents the I–V plot of a RTD, trace B represents the effects of the same RTD with an increased area, and trace C shows the effects of adding a series resistance to the RTD of trace B. It can be seen that a larger diode area increases the peak current, and that a series resistance increases the peak voltage. Therefore, through the control of diode area and series resistance RTDs can be combined in parallel to obtain an I–V plot having multiple peaks with equal separation, such as that shown in FIG. 7. Since the fabrication of RTDs utilizes material growth and photolithography, the area of each RTD may be easily controlled. By properly choosing the area ratios of the RTDs, the same load resistance shifts the peak voltages proportionally. For example, the RTD area may be varied by 1% steps from RTD to RTD such that a multiple peak RTD with as little as 5 mV peak-to-peak separation may be fabricated. The less than 5 mV peak width can be achieved by designing and constructing the RTD device for conduction at zero bias.

Figure 7:
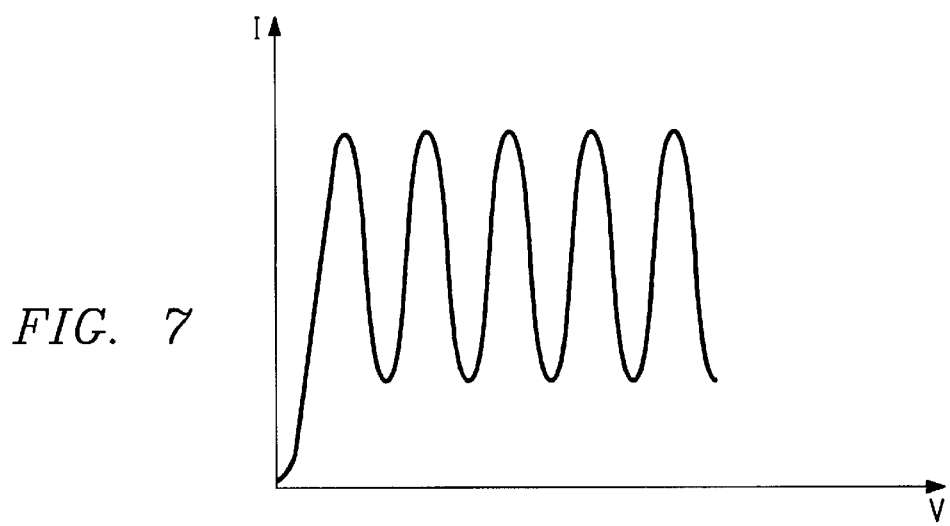
FIG. 7 is a current versus voltage plot of a multiple peak resonant tunneling diode.
Figure 8:
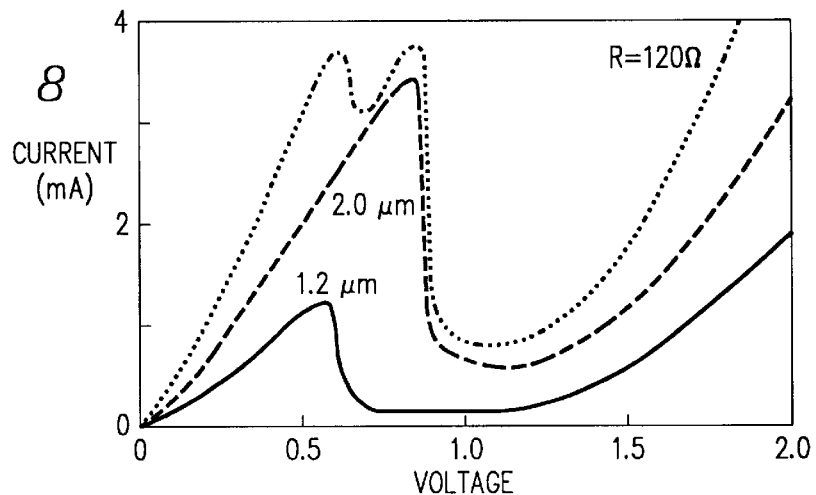
FIG. 8 is a current versus voltage plot of a multiple peak device having RTDs of varying cross-sectional areas and constant series resistance.

Therefore, FIG. 1 shows device 12 with a series load resistor 62 and RTD 64. Device 13 preferably includes the same construction of layers 34–48 as that of device 12 to form a series resistor 66 and a RTD 68. However, the diameter or cross-sectional areas of layers 34–42, or RTD 68, are increased from that of RTD 64. For example, if RTD 64 in device 12 has a diameter of 1.2 μm, then RTD 68 in device 13 may have a diameter of 2 μm. The two terminals of multiple peak RTD are formed by a parallel connection of ohmic contacts 30 and 48 for one terminal, and forming a common ohmic contact 50 on substrate 16 for the other terminal. Additional devices may be similarly formed that have proportionally increased diode sizes and/or resistance values. Therefore, multiple peak RTD 10 may include multiple devices 12, 13 and 70, where the series resistances and diode areas are determined and fabricated such that a desired I–V characteristic plot, such as the one shown in FIG. 7, is achieved. Shown in FIG. 8 is an exemplary dual peak I–V characteristic of a parallel combination of RTDs with differing areas and constant series resistance.

Figures 2, 4:
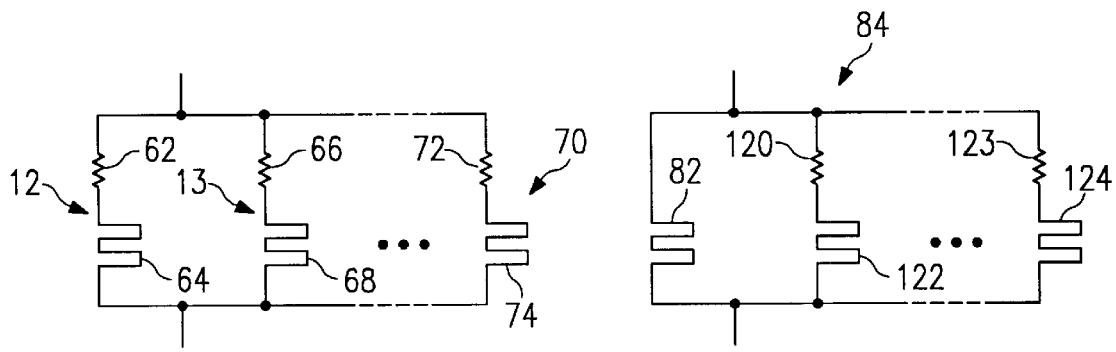
FIG. 2 is a schematic circuit diagram of the preferred embodiment of the multiple peak resonant tunneling diode shown in FIG. 1.
FIG. 4 is a schematic circuit diagram of the preferred embodiment of the multiple peak resonant tunneling diode shown in FIG. 3.
Figure 3:
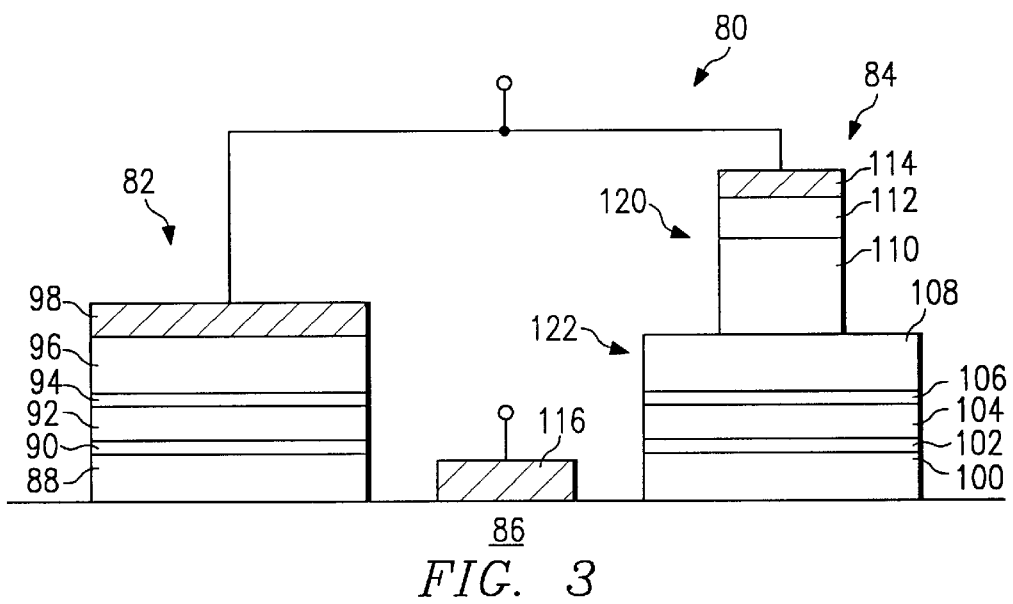
FIG. 3 is a schematic cross-sectional view of yet another preferred embodiment of the multiple peak resonant tunneling diode fabricated according to the present invention.

Referring to FIGS. 3 and 4, an alternate embodiment 80 of the instant multiple peak RTD 10 is shown. Multiple peak RTD 80 includes a single peak RTD 82 and a resistor-RTD device 84, such as those described above. Single peak RTD 82 is constructed by forming a contact layer 88 on top of a substrate layer 86. An aluminum arsenide (AlAs) barrier layer 90, a well layer 92, a second AlAs barrier layer 94, and a RTD n+ layer 96 are formed successively. An ohmic contact 98 is then formed on top of layer 96, and a ohmic contact 116 is formed on substrate 86.

Figure 9:
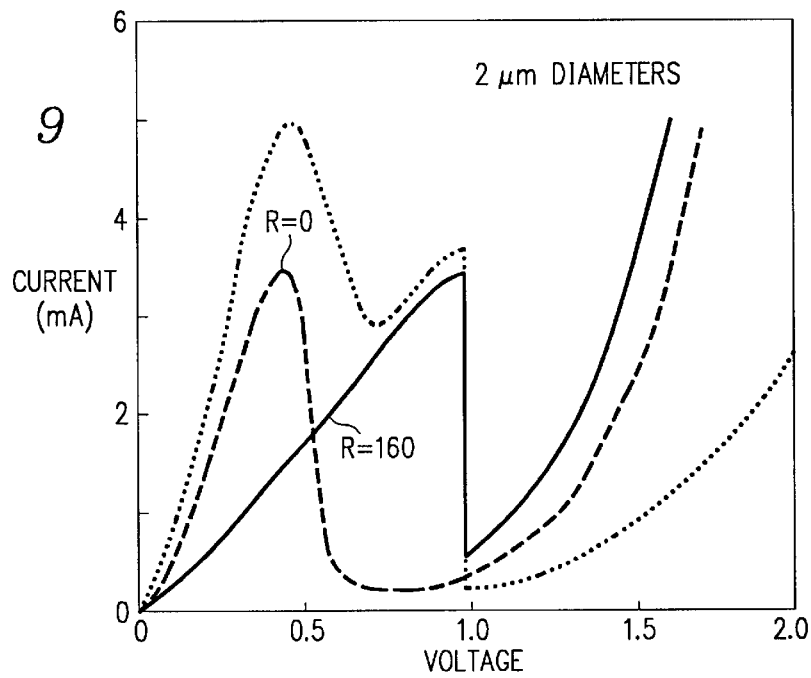
FIG. 9 is an exemplary current versus voltage plot of a multiple peak device having RTDs of same cross-sectional areas and varying series resistance.

Device 84 includes the same layers 100–114, or resistor 120 and RTD 122, as that of device 12 as shown in FIG. 1 and described above. An equivalent circuit schematic is shown in FIG. 4. In embodiment 80, the diode areas of each device may remain constant while the resistance of the series load resistors may increase accordingly to shift the I–V characteristics of respective devices and increase the peak voltages thereof. For example, the diode diameters of RTD 82 and 122 may both be 2 μm, but the resistance of resistor 120 may be 160 Ω to shift the peak voltage of RTD 122. Therefore, the resistances of resistors 123 of subsequent devices with RTDs 124 (FIG. 4), for example, may increase accordingly to achieve the desired peak-to-peak separation and characteristics. Shown in FIG. 9 is an exemplary dual peak I–V characteristic of a parallel combination of RTDs with the same area but different series resistance.

Figure 5:
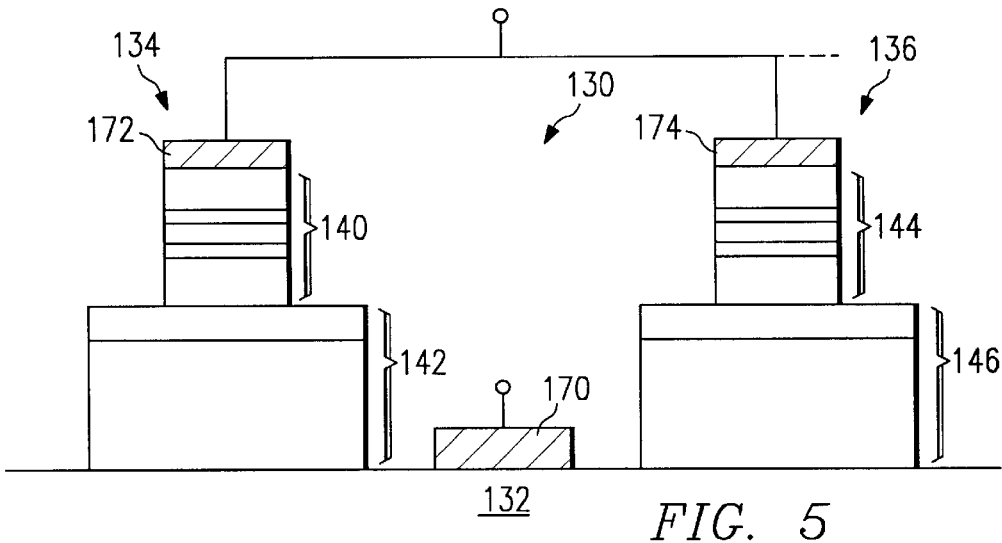
FIG. 5 is a schematic cross-sectional view of yet another preferred embodiment of the multiple peak resonant tunneling diode fabricated according to the present invention.

In FIG. 5, yet another alternative embodiment 130 of the instant invention is shown. Multiple peak RTD 130 includes devices 134 and 136, each consisting of a series resistor 142 and 146 and an RTD 140 and 144 constructed as those described above. However, as shown in FIG. 5, devices 134 and 136 may be fabricated such that the resistors 142 and 146 are formed immediately above a substrate 132, and below RTDs 140 and 144, respectively. Ohmic contacts 172 and 174 are provided on top of RTDs 140 and 144, and a substrate ohmic contact 170 is similarly fabricated as described above. The diode areas and resistor values of devices 134 and 136 and any additional devices may be similarly varied to achieve the desired I–V characteristics.

Figure 10:
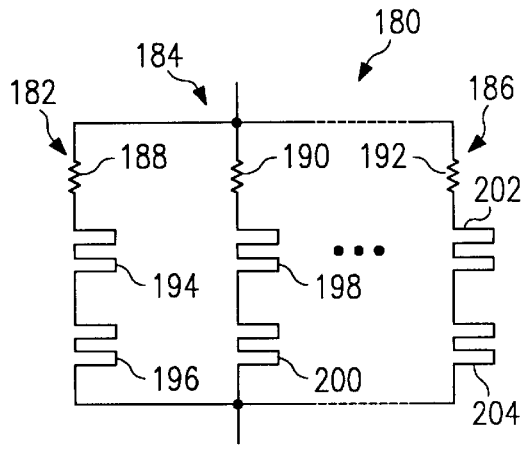
FIG. 10 is a schematic circuit diagram of an alternate embodiment of a multiple peak device having resistors in series with multiple RTDs coupled in parallel.
Figure 11:
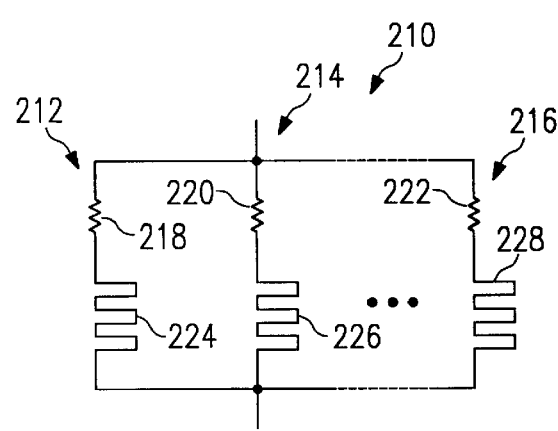
FIG. 11 is a schematic circuit diagram of a multiple peak device with multiple-barrier RTDs.

Referring to FIGS. 10 and 11, other contemplated embodiments of the present invention are shown. Multiple peak device 180 in FIG. 10 includes parallelly-connected vertical structures 182–186, each of which includes a series resistor 188–192, and at least two double-barrier resonant tunneling diodes 194–204. As described and explained above, the doping concentration of resistors 188–192 and the cross-sectional areas of resonant tunneling diodes 194–204 are constructed to achieve the desired I–V characteristics.

In FIG. 11, multiple peak device 210 includes multiple vertical structures 212–216 coupled in parallel. Each structure 212–216 includes a resistor 218–222 coupled in series with at least one multiple-barrier resonant tunneling diode 224–228. As before, vertical structures 212–216 are coupled in parallel to achieve the desired multiple peak I–V characteristics.

In summary, since the multiple peak RTD 10 is vertical in structure, considerable real estate savings are available. In addition, by using conventional material growth and photolithography methods, the variation in the dimensions of each vertical resistor—RTD structure may be easily controlled during fabrication. Furthermore, desirable I–V characteristics of multiple peak RTD 10 are achievable in normal operating conditions. Although the present invention has been described in detail, it should be understood that various changes, substitutions and alterations can be made thereto without departing from the spirit and scope of the present invention as defined by the appended claims.

What is claimed is:

1. A semiconductor device exhibiting multiple peaks in its current-voltage characteristic, said device comprising:
   a plurality of vertical semiconductor structures disposed on a horizontal substrate and connected in parallel, each vertical semiconductor structure including a resonant tunneling diode and a series resistor, wherein said vertical semiconductor structures are comprised of:
   a first low resistive layer formed on said horizontal substrate;
   a first barrier layer having a predetermined cross-sectional area formed on said first low resistive layer:
   a quantum well layer having said predetermined cross-sectional area formed on said first barrier layer:
   a second barrier layer having said predetermined cross-sectional area formed on said quantum well layer;
   a second low resistive layer formed on said second barrier layer;
   a resistive layer having a predetermined doping concentration formed on said second low resistive layer;
   a third low resistive layer formed on said resistive layer; and an ohmic contact formed on said third low resistive layer.

2. A multiple peak resonant tunneling diode comprising:
   a first multiple peak resonant tunneling diode; and
   at least one other multiple peak tunneling diode in parallel with said first multiple peak resonant tunneling diode.

3. The multiple peak resonant tunneling diode device set forth in claim 2, wherein a resistive layer is in series with at least one of said multiple peak resonant tunneling diodes.

4. The multiple peak resonant tunneling diode device set forth in claim 2, wherein said multiple peak resonant tunneling diodes are comprised of horizontal layers on a horizontal semiconductor substrate.

5. The multiple peak resonant tunneling diode device as set forth in claim 2, and further comprising at least one resonant tunneling diode in series with at least one of said resonant tunneling diodes.

6. The multiple peak resonant tunneling diode device, as set forth in claim 2, wherein at least one of said resonant tunneling diodes includes more than two barrier layers.

7. The multiple peak resonant tunneling diode device, as set forth in claim 2, wherein each resonant tunneling diode comprises:
   a first barrier having a cross-sectional area;
   a quantum well having said cross-sectional area in contact with said first barrier layer; and
   a second barrier having said cross-sectional area in contact with said quantum well.

8. The multiple peak resonant tunneling diode device, as set forth in claim 2, wherein each resonant tunneling diode comprises:
   a first low resistive layer formed on top of a semiconductor substrate;
   a first barrier having a cross-sectional area formed on top of said first low resistive layer;
   a quantum well having said cross-sectional area formed on top of said first barrier layer; a second barrier having said cross-sectional area formed on top of said quantum well;
   a second low resistive layer formed on top of said second barrier layer;
   a resistive layer having a predetermined doping concentration formed on top of said low resistive layer;
   a third low resistive layer formed on top of said resistive layer; and
   an ohmic contact formed on top of said third low resistive layer.

9. The multiple peak resonant tunneling diode device, as set forth in claim 2, wherein each resonant tunneling diode comprises:
   a first low resistive layer formed on top of a semiconductor substrate;
   a resistive layer having a predetermined doping concentration formed on top of said low resistive layer;
   a second low resistive layer formed on top of said resistive layer;
   a first barrier having a cross-sectional area formed on top of said second low resistive layer;
   a quantum well having said cross-sectional area formed on top of said first barrier layer;
   a second barrier having said cross-sectional area formed on top of said quantum well;
   a third low resistive layer formed on top of said second barrier; and
   an ohmic contact formed on top of said third low resistive layer.

10. The multiple peak resonant tunneling diode device, as set forth in claim 8, further comprising a second ohmic contact formed on top of said substrate.

11. The multiple peak resonant tunneling diode device, as set forth in claim 2, wherein the peak voltages of said resonant tunneling diodes differ by a predetermined amount.

12. A semiconductor device exhibiting multiple peaks in its current-voltage, characteristic, said device comprising a plurality of multiple peak resonant tunnelling diodes formed vertically with respect to a horizontal substrate, said multiple peak resonant tunnelling diodes being connected in parallel with one another.

13. The semiconductor device, as set forth in claim 12, wherein the peak voltages of said resonant tunneling diodes differ by a predetermined amount.

14. A semiconductor device exhibiting multiple peaks its current-voltage characteristic, said device comprising:
   a plurality of vertical semiconductor structures disposed on a horizontal substrate and connected in parallel, each vertical semiconductor structure including a multiple peak diode and a series resistance tunneling diode and a series resistor.

15. The semiconductor device, as set forth in claim 12, wherein each said vertical semiconductor structure comprises at least two resonant tunneling diodes having more than two barriers.

* * * * *